United States Patent
Drost et al.

(10) Patent No.: US 7,046,017 B1
(45) Date of Patent: May 16, 2006

(54) FULL-WAVE RECTIFIER FOR CAPACITANCE MEASUREMENTS

(75) Inventors: Robert J. Drost, Mountain View, CA (US); Ronald Ho, Mountain View, CA (US); Ivan E. Sutherland, Santa Monica, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/216,754

(22) Filed: Aug. 30, 2005

Related U.S. Application Data (62) Division of application No. 10/879,608, filed on Jun. 28, 2004.

(60) Provisional application No. 60/505,106, filed on Sep. 22, 2003.

(51) Int. Cl.
  *G01R 27/26* (2006.01)
  *G01N 27/22* (2006.01)

(52) U.S. Cl. ...................................... 324/678; 324/680

(58) Field of Classification Search ................... None
See application file for complete search history.

(56) References Cited

U.S. PATENT DOCUMENTS

| | | | | |
|---|---|---|---|---|
| 3,577,072 A | * | 5/1971 | Miller | 324/680 |
| 5,629,838 A | | 5/1997 | Knight et al. | 361/782 |
| 6,366,098 B1 | * | 4/2002 | Froment | 324/678 |
| 6,728,113 B1 | | 4/2004 | Knight et al. | 361/760 |
| 6,916,719 B1 | | 7/2005 | Knight et al. | 438/381 |

* cited by examiner

*Primary Examiner*—Vincent Q. Nguyen
(74) *Attorney, Agent, or Firm*—Park, Vaughan & Fleming LLP (57) ABSTRACT

One embodiment of the present invention provides an electronic circuit and method for measuring a capacitance. A signal generating mechanism generates a signal having a predefined frequency and predefined low and high voltage levels on one terminal of the capacitance. The other terminal of the capacitance is coupled to a switching mechanism. The switching mechanism is set to couple the other terminal of the capacitance to a first amplifier or a second amplifier for a portion of each signal cycle thereby full-wave rectifying a transient current flowing between the two terminals in the capacitance. Outputs of the first amplifier and the second amplifier are coupled to a current measurement mechanism for measuring the current. The capacitance is determined from the measured current. Several variations on this embodiment are provided.

21 Claims, 5 Drawing Sheets

FULL-WAVE RECTIFIER FOR CAPACITANCE MEASUREMENTS

RELATED APPLICATION

This application is a divisional under 37 C.F.R §1.53(b) of and claims priority under 35 U.S.C. §121 to a co-pending non-provisional application by the same inventor as the instant application entitled, "Full-Wave Rectifier For Capacitance Measurements," having Ser. No. 10/879,608, and filing date 28 Jun. 2004. Note that this parent application claimed priority under 35 U.S.C. §119 to U.S. Provisional Patent Application No. 60/505,106 filed on 22 Sep. 2003, entitled "Full-Wave Rectifier for Capacitance Measurements," by inventors Robert J. Drost, Ronald Ho and Ivan E. Sutherland.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to an electronic circuit. More specifically, the present invention relates to a full-wave-rectifier circuit that improves a resolution of on-chip or chip-to-chip capacitance measurements.

2. Related Art

Advances in semiconductor technology presently make it possible to integrate large-scale systems, including tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

However, these advances in semiconductor technology also pose challenges in intra- and inter-chip communication. Increasing the number of transistors on a single semiconductor chip requires a reduction in the critical dimensions of the transistors and the on-chip signal lines. This reduction in the critical dimensions reduces the capacitances associated with the transistors and on-chip signal lines. These capacitances are critical to chip performance, especially as the chip speed increases. Unfortunately, the reduced capacitances are increasingly difficult to measure. Note that is often necessary to measure these capacitances to calibrate the electronic tools used to design the semiconductor chips and for manufacturing process control purposes.

In addition, the reduction in the critical dimension of the on-chip signal lines is making integration of the semiconductor chips onto a printed circuit board that contains multiple layers of signal lines for inter-chip communication increasingly difficult, since the signal lines on a semiconductor chip are about 100 times more densely packed than signal lines on a printed circuit board.

Researchers have begun to investigate alternative techniques for communicating between semiconductor chips. One promising technique involves integrating arrays of capacitive transmitters and receivers onto semiconductor chips to facilitate inter-chip communication by capacitively coupled communication. Such capacitively coupled communication is highly sensitive to inter-chip alignment, which affects capacitance between the semiconductor chips. In many cases, it is useful to be able to measure capacitance to determine the semiconductor chip alignment. However, the capacitances are small and difficult to measure.

Figure 1:
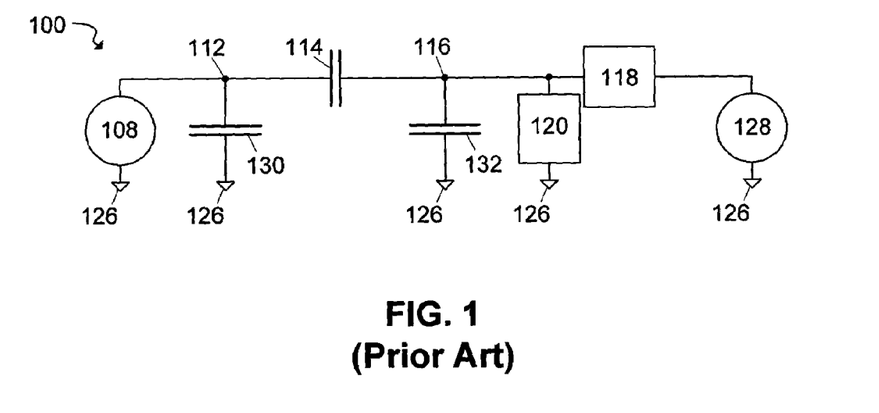
FIG. 1 illustrates a prior art electronic circuit for measuring capacitance.

FIG. 1 illustrates an exemplary electronic circuit 100 for measuring capacitance. A signal source 108 produces a square wave signal 110 (shown in FIG. 2) on a node Vtx 112 that transitions between ground and Vdd. A capacitor device under test $C_{DUT}$ 114 couples a charge of $Q=C_{DUT} \cdot Vdd$ or $Q=-C_{DUT} \cdot Vdd$ onto a node Vrx 116 during rising or falling transitions, respectively, of node Vtx 112. Switches $S_1$ 118 and $S_2$ 120, controlled by Hrect 122 (shown in FIG. 2) and $\overline{Hrect}$ 124 (shown in FIG. 2), respectively, connect node Vrx 116 to ground 126 or an ammeter 128.

Capacitors 130 and 132 represent parasitic capacitances due to wiring and device parasitics. Note that capacitors 130 and 132 do not corrupt the capacitance measurement. Rather, capacitors 130 and 132 only slow the signal transitions on nodes Vtx 112 and Vrx 116.

Figure 2:
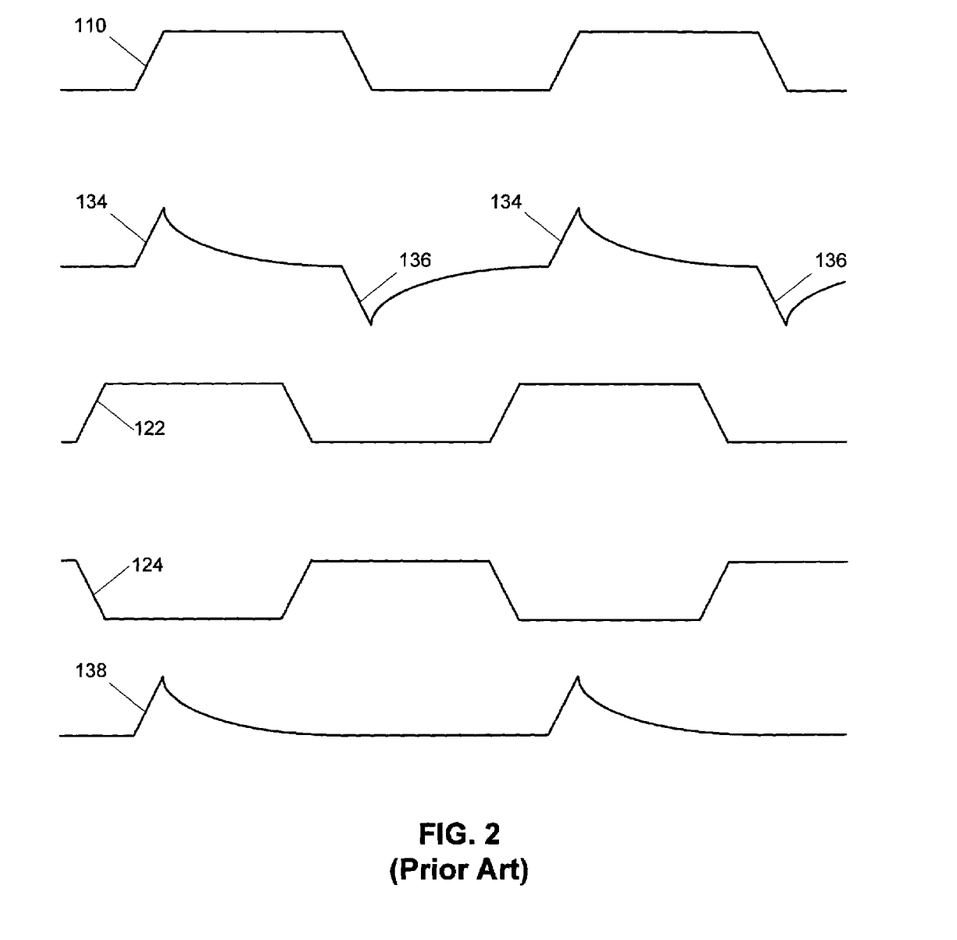
FIG. 2 illustrates signal waveforms as a function of time for the electronic circuit in the prior art.

FIG. 2 illustrates signal waveforms as a function of time for electronic circuit 100. The square wave signal 110 on node Vtx 112 couples positive pulses 134 and negative pulses 136 onto node Vrx 116. The positive pulses 134 and negative pulses 136 on Vrx 116 decay as the charge Q on node Vrx 116 is drained through switch $S_1$ 118 or $S_2$ 120. When Hrect 122 is high, switch $S_1$ 118 conducts current and switch $S_2$ 120 blocks current. In this case, the ammeter 128 drains the charge Q from the node Vrx 116 and measures a resulting transient current 138. When Hrect 122 is low, switch $S_1$ 118 blocks current and switch $S_2$ 120 conducts current. Following a negative transition on node Vtx 112, current flows through switch $S_2$ 120 to replenish the charge Q removed from node Vrx 116 by the negative transition.

This electronic circuit half-wave rectifies each cycle of charge Q, which is drained through the ammeter 128. For the square wave signal 110 produced by the signal source 108 with a fundamental frequency f, the average current in the ammeter 128 is $f \cdot C_{DUT} \cdot Vdd$. The capacitance of the capacitor device under test $C_{DUT}$ 114 is determined from the measured average current.

The small capacitances associated with the transistors and on-chip signal lines on semiconductor chips, and the small capacitances between semiconductor chips in capacitively coupled communication, which are discussed above, give rise to small displacement currents. As discussed above, it is increasingly difficult to measure these currents with existing techniques. What is needed is an improved method and an apparatus for measuring capacitance without the problems listed above.

SUMMARY

One embodiment of the present invention provides an electronic circuit and method for measuring a capacitance. A signal generating mechanism generates a signal having a predefined frequency and predefined low and high voltage levels on one terminal of the capacitance. The other terminal of the capacitance is coupled to an electrical network with at least four nodes and four switching mechanisms coupled between pairs of these nodes. A first pair of switching mechanisms is set to be substantially open, thereby substantially blocking current, when a second pair of switching mechanisms is set to be substantially closed, thereby substantially conducting current. When the first pair of switching mechanisms is set to be substantially closed, thereby substantially conducting current, the second pair of switching mechanisms is set to be substantially open, thereby substantially blocking current. In this way, a current associated with each cycle of the signal is full-wave rectified and is measured with a current measurement mechanism coupled between two nodes in the network. The capacitance is determined from the measured current. Several variations on this embodiment are provided.

Another embodiment of the present invention provides another electronic circuit and method for measuring the capacitance. A signal generating mechanism generates a signal having a predefined frequency and predefined low and high voltage levels on one terminal of the capacitance. The other terminal of the capacitance is coupled to a switching mechanism. The switching mechanism is set to couple the other terminal of the capacitance to a first amplifier or a second amplifier for a portion of each signal cycle thereby full-wave rectifying a current flowing between the two terminals in the capacitance. Outputs of the first amplifier and the second amplifier are coupled to a current measurement mechanism for measuring the current. The capacitance is determined from the measured current.

In variations on this embodiment, the signal is a square wave signal having a fundamental frequency equal to the predefined frequency, the switching mechanism is a switch, such as an NMOS transistor, a PMOS transistor or a CMOS switch, and the current measuring mechanism is an ammeter or a voltmeter coupled in parallel with an impedance, such as a resistor.

In another variation on this embodiment, the switching mechanism couples the other terminal of the capacitance to the first amplifier for a predetermined duration of time that includes when the signal transitions from the low voltage level to the high voltage level, and the switching mechanism couples the other terminal of the capacitance to the second amplifier for a predetermined duration of time that includes when the signal transitions from the high voltage level to the low voltage level.

In another variation on this embodiment, the switching mechanism couples the other terminal of the capacitance to the first amplifier for the predetermined duration of time that includes when the signal transitions from the high voltage level to the low voltage level, and the switching mechanism couples the other terminal of the capacitance to the second amplifier for the predetermined duration of time that includes when the signal transitions from the low voltage level to the high voltage level.

In another variation on this embodiment, the first amplifier is a NMOS current mirror with a gain and the second amplifier has a PMOS current mirror with unity gain as a first stage and a NMOS current mirror with substantially the gain as a second stage. In another variation on this embodiment, the first amplifier is a PMOS current mirror with the gain and the second amplifier has a NMOS current mirror with unity gain as a first stage and a PMOS current mirror with substantially the gain as a second stage.

In another variation on this embodiment, the first amplifier is a PMOS current mirror with unity gain as a first stage and a NMOS current mirror with the gain as a second stage and the second amplifier is a NMOS current mirror with substantially the gain. In another variation on this embodiment, the first amplifier is a NMOS current mirror with unity gain as a first stage and a PMOS current mirror with the gain as a second stage and the second amplifier is a PMOS current mirror with substantially the gain.

In another embodiment, the gain is substantially between 10–100.

In yet another embodiment, a first current biasing mechanism is coupled in parallel with an input of the first amplifier and a second current biasing mechanism of opposite polarity to the first current biasing mechanism is coupled in parallel with an input of the second amplifier. The bias current in the first current biasing mechanism and the second current biasing mechanism may be substantially less than the current flowing through the capacitance coupled to the switching mechanism.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Full-Wave Rectifier for Capacitance Measurements

Figure 3:
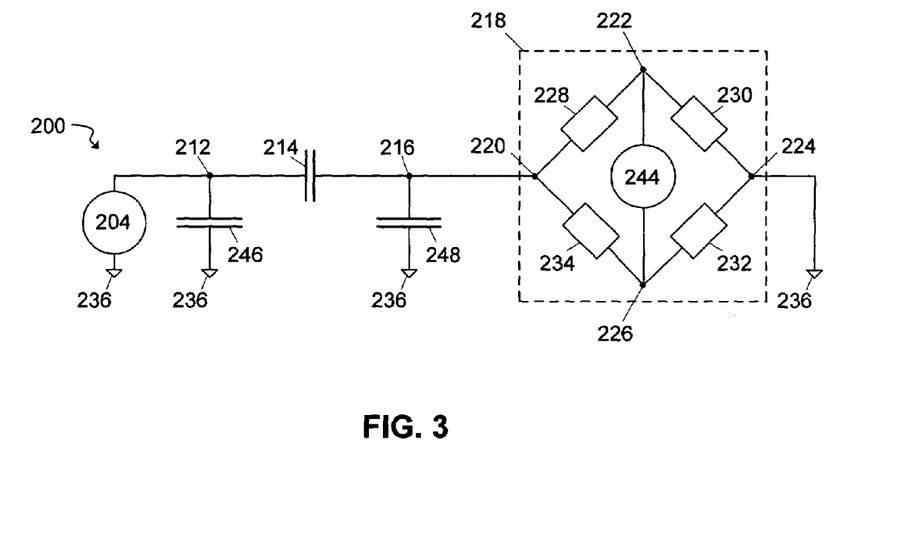
FIG. 3 illustrates an electronic circuit for measuring capacitance in accordance with an embodiment of the present invention.

FIG. 3 illustrates an electronic circuit 200 in accordance with an embodiment of the present invention. A signal source 204 generates a signal having a predefined frequency and predefined low 206 (shown in FIG. 4) and high voltage 208 levels (shown in FIG. 4) on a node Vtx 212.

Figure 4:
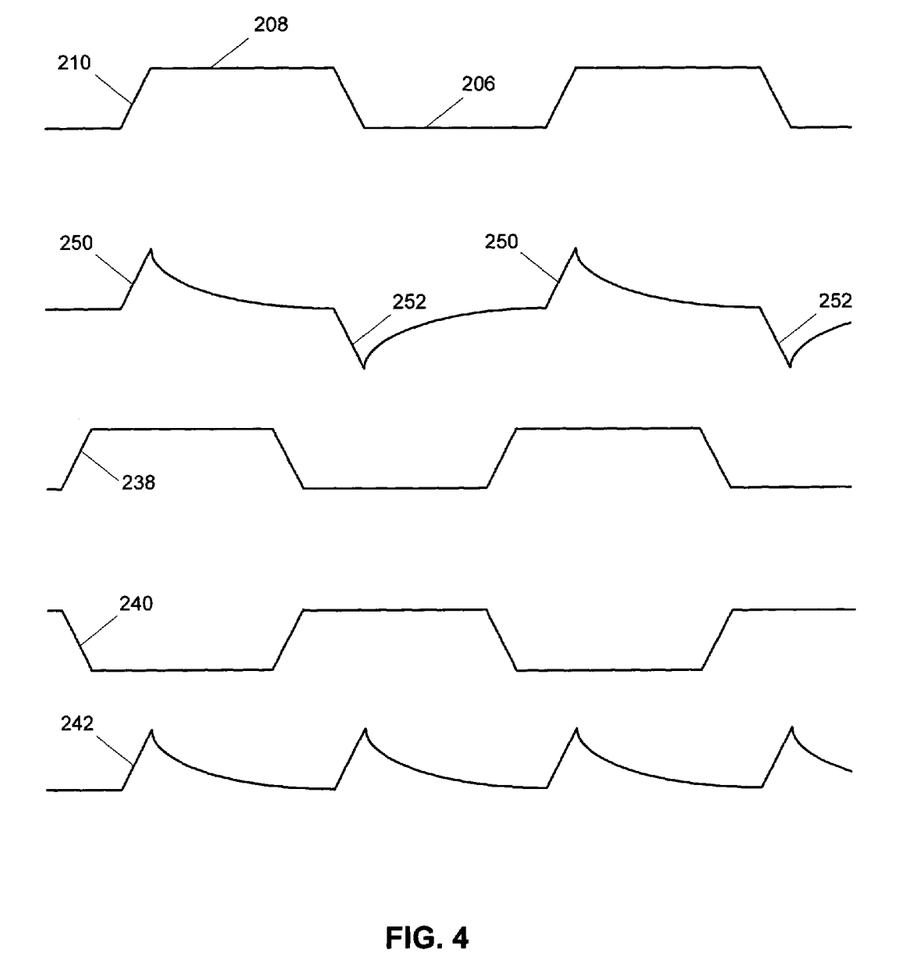
FIG. 4 illustrates signal waveforms as a function of time for electrical circuits in accordance with an embodiment of the present invention.

Referring to FIG. 4, in an embodiment of the present invention the signal is a square wave signal 210 with a rise time and a fall time, has a fundamental frequency corresponding to the predefined frequency, and the predefined low voltage level 206 is ground and the predefined high voltage level 208 is Vdd. Negative voltages and bipolar voltages are also suitable for the predefined low voltage level 206 and the predefined high voltage level 208 in the present invention. Embodiments where the signal is a square wave signal 210 and the predefined low voltage level 206 is ground and the predefined high voltage level 208 is Vdd are described below as illustrative examples.

Referring to FIG. 3, a capacitor device under test $C_{DUT}$ 214 is coupled between node Vtx 212 and a node Vrx 216. The capacitor device under test $C_{DUT}$ 214 couples the charge of $Q=C_{DUT} \cdot Vdd$ or $Q=-C_{DUT} \cdot Vdd$ onto a node Vrx 216 during rising or falling transitions, respectively, of node Vtx 212.

Node Vrx 216 is coupled to an electrical network 218 having at least four nodes, (A) 220, (B) 222, (C) 224 and (D) 226. A first switching mechanism 228 is coupled between nodes (A) 220 and (B) 222. A second switching mechanism 230 is coupled between nodes (B) 222 and (C) 224. A third switching mechanism 232 is coupled between nodes (C) 224 and (D) 226. A fourth switching mechanism 234 is coupled between nodes (D) 226 and (A) 220. Node (C) 224 is connected to a grounding mechanism 236 for coupling node (C) 224 to electrical ground.

In an embodiment of the present invention, first switching mechanism 228, second switching mechanism 230, third switching mechanism 232 and fourth switching mechanism 234 are switches including NMOS transistors, PMOS transistors and CMOS switches.

The first switching mechanism 228 and the third switching mechanism 232 constitute a first pairing controlled by Frect 238 (shown in FIG. 4). The second switching mechanism 230 and the fourth switching mechanism 234 constitute a second pairing controlled by $\overline{Frect}$ 240 (shown in FIG. 4). The first pairing is set to be substantially opened, thereby substantially blocking current, when the second pairing is set to be substantially closed, thereby substantially conducting current. When the first pairing is set to be substantially closed, the second pairing is set to be substantially opened. By alternating substantially opening and substantially closing the first pairing and the second pairing the transient current 242 (shown in FIG. 4), associated with the charge Q flowing between Vtx 212 and Vrx 216 in the capacitor device under test $C_{DUT}$ 214, is full-wave rectified.

In one embodiment of the present invention, the first pairing substantially blocks current and the second pairing substantially conducts current for a predetermined duration of time that includes when the signal transitions from ground to Vdd. Furthermore, the first pairing substantially conducts current and the second pairing is substantially blocks current for the predetermined duration of time that includes when the signal transitions from Vdd to ground. In an alternate embodiment of the present invention, the first pairing substantially blocks current and the second pairing substantially conducts current for the predetermined duration of time that includes when the signal transitions from Vdd to ground. Furthermore, the first pairing substantially conducts current and the second pairing is substantially blocks current for the predetermined duration of time that includes when the signal transitions from ground to Vdd. In the embodiments, the switches in the first and second pairing should be switched sufficiently before a transition in the signal such that a steady state condition is substantially obtained. This ensures that switching transients do not substantially affect the measurements with the electronic circuit 200.

The predetermined time is substantially greater than a time necessary for the transient current 242 to substantially decay. The fundamental frequency of the square wave signal 210 is chosen such that each half period or cycle is substantially greater than the time necessary for the transient current 242 to decay. Note that the time necessary for the transient current 242 to decay is determined by the RC time constant associated with the capacitor device under test $C_{DUT}$ 214.

In FIG. 3, a current measuring mechanism 244 is coupled between node (B) 222 and node (D) 226 to measure the full-wave rectified transient current 242. In one embodiment of the present invention, the current measuring mechanism 244 is an ammeter. In another embodiment of the present invention, the current measuring mechanism 244 is a voltmeter coupled in parallel with an impedance such as a resistor. As was the case in the prior art electrical circuit shown in FIG. 1, capacitors 246 and 248, representing parasitic capacitances due to wiring and device parasitics, do not corrupt the capacitance measurement. Rather, capacitors 246 and 248 only slow the signal transitions on nodes Vtx 212 and Vrx 216.

FIG. 4 illustrates signal waveforms for the electronic circuit 200 in the present invention. The square wave signal 210 on node Vtx 212 couples positive pulses 250 and negative pulses 252 onto node Vrx 216. Taking the embodiment where the first pairing substantially conducts current and the second pairing substantially blocks current for the predetermined duration of time that includes when the signal transitions from ground to Vdd as an illustrative example, the positive pulses 250 on node 216 decay as the charge Q on node Vrx 216 is drained through the electrical network 218 and the current measuring mechanism 244. The charge Q moves through the current measuring mechanism 244 in a direction that causes a positive current measurement. Then, when the first pairing substantially conducts blocks current and the second pairing substantially conducts current for the predetermined duration of time that includes when the signal transitions from Vdd to ground, the negative pulses 252 decay as the charge Q on node Vrx 216 is replenished by the charge Q pulled from the ground mechanism 236 via the current measuring mechanism 244 and the electrical network 218. Since this arrangement reverses which terminal of the current measuring mechanism 244 connects to node Vrx 216 and to the ground mechanism 236, the charge Q moves through the current measuring mechanism 244 in the direction that again causes the positive current measurement. Thus the transient current 242 is full-wave rectified.

The capacitance of the capacitor device under test $C_{DUT}$ 214 is determined from the measured average current. For the square wave signal 210 generated by the signal source 204 with a fundamental frequency f, the average current in the current measuring mechanism 244 is $2f \cdot C_{DUT} \cdot Vdd$. Therefore, the average current in the current measuring mechanism 244 in this embodiment of the present invention is twice that of the prior art electronic circuit. This enables more accurate determination of the capacitance of the capacitor device under test $C_{DUT}$ 214 as well as determining of a smaller capacitance of the capacitor device under test $C_{DUT}$ 214.

Amplified Full-Wave Rectifier

Figure 5:
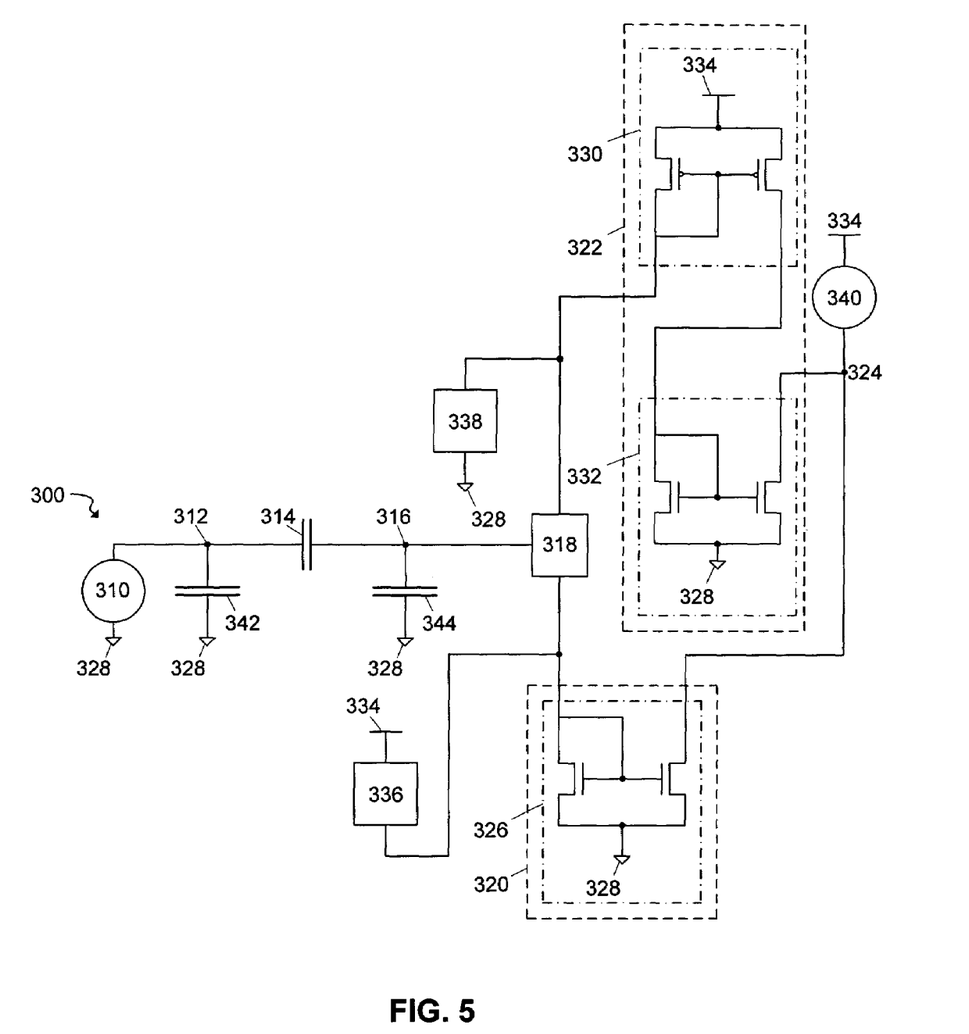
FIG. 5 illustrates an electronic circuit for measuring capacitance in accordance with an embodiment of the present invention.

FIG. 5 illustrates an electronic circuit 300 in accordance with the present invention. A signal source 310 generates a signal having a predefined frequency and predefined low and high voltage levels on a node Vtx 312.

In an embodiment of the present invention, the signal is a square wave signal with a rise time and a fall time, has a fundamental frequency corresponding to the predefined frequency, and the predefined low voltage level is ground and the predefined high voltage level is Vdd. Negative voltages and bipolar voltage are also suitable for the predefined low voltage level and the predefined high voltage level in the present invention. Embodiments where the signal is a square wave signal and the predefined low voltage level is ground and the predefined high voltage level is Vdd are described below as illustrative examples.

A capacitor device under test $C_{DUT}$ 314 is coupled between node Vtx 312 and a node Vrx 316. The capacitor device under test $C_{DUT}$ 314 couples the charge of $Q=C_{DUT} \cdot Vdd$ or $Q=-C_{DUT} \cdot Vdd$ onto a node Vrx 316 during rising or falling transitions, respectively, of node Vtx 312.

Node Vrx 316 is coupled to a switching mechanism 318 for coupling node Vrx 316 to a first amplifier 320 or a second amplifier 322. Outputs of the first amplifier 320 and the second amplifier are coupled to an output node 324 of the electronic circuit 300, wherein output node 324 is coupled through ammeter 340 to power supply 324. By coupling node Vrx 316 to the first amplifier or the second amplifier a transient current associated with the charge Q, flowing between Vtx 312 and Vrx 316 in the capacitor device under test $C_{DUT}$ 314, is full-wave rectified.

In an embodiment of the present invention, the switching mechanism 318 is a switch such as an NMOS transistor, a PMOS transistor and a CMOS switch.

In one embodiment of the present invention, the switching mechanism 318 couples node Vrx 316 to the first amplifier 320 for the predetermined duration of time that includes when the signal transitions from ground to Vdd, and the switching mechanism 318 couples node Vrx 316 to the second amplifier 322 for the predetermined duration of time that includes when the signal transitions from Vdd to ground.

In an alternate embodiment of the present invention, the switching mechanism 318 couples node Vrx 316 to the first amplifier 320 for the predetermined duration of time that includes when the signal transitions from Vdd to ground, and the switching mechanism 318 couples node Vrx 316 to the second amplifier 322 for the predetermined duration of time that includes when the signal transitions from ground to Vdd.

The predetermined time is substantially greater than a time necessary for the transient current to substantially decay. The fundamental frequency of the square wave signal is chosen such that each half period or cycle is substantially greater than the time necessary for the transient current to decay. Note that the time necessary for the transient current to decay is determined by the RC time constant associated with the capacitor device under test $C_{DUT}$ 314.

In FIG. 5, the first amplifier 320 is an NMOS current mirror 326 with a gain. The NMOS current mirror 326 is connected to a grounding mechanism 328 for coupling the NMOS current mirror 326 to electrical ground. The second amplifier has a PMOS current mirror 330 with unity gain in a first stage and a NMOS current mirror 332 with substantially the gain in a second stage. The PMOS current mirror 330 is coupled a voltage generator 334 for connecting the PMOS current mirror 330 to Vdd. The NMOS current mirror 332 is connected to a grounding mechanism 328 for coupling the NMOS current mirror 332 to electrical ground. In an exemplary embodiment, the gain is substantially between 10–100. In the electronic circuit 300, the switching mechanism 318 couples node Vrx 316 to the first amplifier 320 for the predetermined duration of time that includes when the signal transitions from ground to Vdd. Transient current flows into node Vrx 316 resulting in an amplified output signal on output node 324. The switching mechanism 318 couples node Vrx 316 to the second amplifier 322 for the predetermined duration of time that includes when the signal transitions from Vdd to ground. Transient current flows out of node Vrx 316. The PMOS current mirror 330 changes the current direction but not the current magnitude. The NMOS current mirror 332 substantially duplicates NMOS current mirror 326 resulting in the amplified output signal on output node 324. In this way, the transient current is full-wave rectified.

FIG. 5 also illustrates an optional first current biasing mechanism 336 coupled in parallel with the first amplifier 320 and an optional second current biasing mechanism 338 of opposite polarity to the first current biasing mechanism 336 coupled in parallel with the second amplifier 322. In FIG. 5, a bias current from the first current biasing mechanism 336 is pushed into the first amplifier 320 and a bias current from the second current biasing mechanism 338 is pulled from the second amplifier 322. In some embodiments, the bias current from the first current biasing mechanism 336 and the bias current from the second current bias mechanism 338 are less that a peak of the transient current. The bias current improves the transient response of the first amplifier 320 and the transient response of the second amplifier 322. The bias current also allows current to be sourced from the first amplifier 320 into node Vrx 316 and current to be sunk in the second amplifier 322 from node Vrx 316.

In alternate embodiment of the present invention, the first amplifier 320 is a PMOS current mirror with the gain. The second amplifier 322 has a NMOS current mirror with unity gain in a first stage and a PMOS current mirror with substantially the gain in a second stage. In another alternate embodiment of the present invention, the first amplifier 320 has a NMOS current mirror with unity gain in a first stage and a PMOS current mirror with the gain in a second stage. The second amplifier 322 is a PMOS current mirror with substantially the gain. In yet another alternate embodiment of the present invention, the first amplifier 320 has a PMOS current mirror with unity gain in a first stage and a NMOS current mirror with the gain in a second stage. The second amplifier 322 is a NMOS current mirror with substantially the gain.

In FIG. 5, a current measuring mechanism 340 is coupled to the output node 324. In one embodiment of the present invention, the current measuring mechanism 340 is an ammeter. In another embodiment of the present invention, the current measuring mechanism 340 is a voltmeter coupled in parallel with an impedance such as a resistor. As was the case in the prior art electrical circuit shown in FIG. 1 and the electrical circuit 200 in the present invention shown in FIG. 3, capacitors 342 and 344, representing parasitic capacitances due to wiring and device parasitics, do not corrupt the capacitance measurement. Rather, capacitors 342 and 344 only slow the signal transitions on nodes Vtx 312 and Vrx 316.

The capacitance of the capacitor device under test $C_{DUT}$ 314 is determined from the measured average current. For the square wave signal generated by the signal source 310 with a fundamental frequency f, the average current divided by a gain in the current measuring mechanism 340 is $2f \cdot C_{DUT} \cdot Vdd$ (note that in exemplary embodiments, the gain is between 5 and 20). Therefore, the average current divided by the gain in the current measuring mechanism 340 in this embodiment of the present invention is twice that of the prior art electronic circuit. This enables more accurate determination of the capacitance of the capacitor device under test $C_{DUT}$ 314 as well as determining a smaller capacitance of the capacitor device under test $C_{DUT}$ 314.

A method of using the electrical circuit 200 (shown in FIG. 3) and the electrical circuit 300 (shown in FIG. 5) allows offsets to be eliminated from the determination of the capacitance of the capacitor device under test $C_{DUT}$ 214 and the capacitor device under test $C_{DUT}$ 314. After making a first determination of the capacitance using electrical circuit 200 or electrical circuit 300, the phase of the signal is changed by 180° and a second determination of the capacitance is made. The offsets are removed by taking the difference between the first determination of the capacitance and the second determination of the capacitance and dividing the result by 2.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An electrical circuit for measuring capacitance, comprising:
   a signal generating mechanism for generating a signal having a predefined frequency and predefined low and high voltage levels;
   a switching mechanism for coupling an input to one of two outputs;
   a first amplifier with a gain, wherein an input of the first amplifier is coupled to a first of the outputs of the switching mechanism and an output of the first amplifier is coupled to an output node in the circuit;
   a second amplifier with a gain, wherein an input of the second amplifier is coupled to a second of the outputs of the switching mechanism and an output of the second amplifier is coupled to the output node; and
   a load having at least two terminals and an unknown capacitance between the terminals, wherein one of the terminals is coupled to the signal generating mechanism and another of the terminals is coupled to the input of the switching mechanism, wherein the switching mechanism is selectively substantially coupled to the first amplifier and the second amplifier in order to full-wave rectify current flowing between the two terminals in the load.

2. The electrical circuit of claim 1, further comprising a current measuring mechanism coupled to the output node.

3. The electrical circuit of claim 2, wherein the current measuring mechanism includes an ammeter.

4. The electrical circuit of claim 2, wherein the current measuring mechanism includes an impedance with a voltage measuring mechanism coupled in parallel with the impedance.

5. The electric circuit of claim 4, wherein the impedance includes a resistor.

6. The electrical circuit of claim 1,
   wherein the switching mechanism couples the load to the first amplifier for a first predetermined duration of time that substantially includes when the signal transitions from the low voltage level to the high voltage level; and
   wherein the switching mechanism couples the load to the second amplifier for a second predetermined duration of time that substantially includes when the signal transitions from the high voltage level to the low voltage level.

7. The electrical circuit of claim 1,
   wherein the switching mechanism couples the load to the first amplifier for a first predetermined duration of time that substantially includes when the signal transitions from the high voltage level to the low voltage level; and
   wherein the switching mechanism couples the load to the second amplifier for a second predetermined duration of time that substantially includes when the signal transitions from the low voltage level to the high voltage level.

8. The electrical circuit of claim 1, wherein the signal generating mechanism includes mechanism for generating a square wave signal having a rise time and a fall time, the square wave signal having a fundamental frequency equal to the predefined frequency and having the predefined low and high voltage levels.

9. The electrical circuit of claim 1, wherein the first amplifier is a NMOS current mirror with the gain of the first amplifier, and the second amplifier has a first stage PMOS current mirror with unity gain and a second stage NMOS current mirror with the gain of the second amplifier.

10. The electrical circuit of claim 1, wherein the first amplifier is a PMOS current mirror with the gain of the first amplifier, and the second amplifier has a first stage NMOS current mirror with unity gain and a second stage PMOS current mirror with the gain of the second amplifier.

11. The electrical circuit of claim 1, wherein the first amplifier has a first stage PMOS current mirror with unity gain and a second stage NMOS current mirror with the gain of the first amplifier, and the second amplifier is a NMOS current mirror with the gain of the second amplifier.

12. The electrical circuit of claim 1, wherein the first amplifier has a first stage NMOS current mirror with unity gain and a second stage PMOS current mirror with the gain of the first amplifier, and the second amplifier is a PMOS current mirror with the gain of the second amplifier.

13. The electrical circuit of claim 1, wherein the gain of the first amplifier and the gain of the second amplifier are substantially between 10 and 100.

14. The electrical circuit of claim 1, further comprising:
   a first current biasing mechanism connected in parallel with the first amplifier at the first output of the switching mechanism; and
   a second current biasing mechanism of opposite polarity to the first current biasing mechanism connected in parallel with the second amplifier at the second output of the switching mechanism, whereby bias current from the first current biasing mechanism and the second current biasing mechanism are less that the current flowing through the load into the input of the switching mechanism.

15. The electrical circuit of claim 1, wherein the switching mechanism is selected from the group including a NMOS transistor, a PMOS transistor and a CMOS switch.

16. A method of determining an unknown capacitance, comprising:
   generating a signal with a signal generating mechanism, wherein the signal has a predefined frequency and predefined low and high voltage levels;
   applying the signal to an input terminal of a load with at least two terminals, wherein the load has an unknown capacitance between the terminals;
   detecting signals developed at an output terminal of the load with a detection circuit, wherein an input of a switching mechanism in the detection circuit is coupled to the output terminal of the load, the switching mechanism couples the input to one of two outputs, a first output of the switching mechanism is coupled to an input of a first amplifier and an output of the first amplifier is coupled to an output node, a second output of the switching mechanism is coupled to an input of a second amplifier and an output of the second amplifier is coupled to the output node, and a current measuring mechanism is coupled to the output node;
   measuring current with the current measuring mechanism; and
   calculating the unknown capacitance from the current.

17. The method of determining an unknown capacitance in claim 16, further comprising:
   substantially coupling the input of the switching mechanism to the first output for a first predetermined duration of time that substantially includes when the signal transitions from the low voltage level to the high voltage level after generating the signal, applying the signal and detecting the signals, and prior to measuring current with the current measuring mechanism.

18. The method of determining an unknown capacitance in claim 17, further comprising:
   substantially coupling the input of the switching mechanism to the second output for a second predetermined duration of time that substantially includes when the signal transitions from the high voltage level to the low voltage level; and
   measuring current with the current measuring mechanism after measuring current and prior to calculating the unknown capacitance from the current.

19. The method of determining an unknown capacitance in claim 16, further comprising:
   substantially coupling the input of the switching mechanism to the first output for a first predetermined duration of time that substantially includes when the signal transitions from the high voltage level to the low voltage level after generating the signal, applying the signal and detecting the signals, and prior to measuring current with the current measuring mechanism.

20. The method of determining an unknown capacitance in claim 19, further comprising:
   substantially coupling the input of the switching mechanism to the second output for a second predetermined duration of time that substantially includes when the signal transitions from the low voltage level to the high voltage level; and
   measuring current with the current measuring mechanism after measuring current and prior to calculating the unknown capacitance from the current.

21. The method of determining an unknown capacitance of claim 16, further comprising:
   changing the phase of the signal by 180°;
   repeating the method of determining the unknown capacitance to determine a second value of the unknown capacitance; and
   taking difference of two calculated capacitance values and dividing the difference by 2 to remove offsets from the calculation.

* * * * *